United States Patent
Chang et al.

(10) Patent No.: US 10,274,990 B1
(45) Date of Patent: Apr. 30, 2019

(54) PHASE ADJUSTING DEVICE AND SYSTEM

(71) Applicant: ANPEC ELECTRONICS CORPORATION, Hsinchu (TW)

(72) Inventors: Yun-Chiang Chang, Hsinchu (TW); Fu-Chuan Chen, Hsinchu (TW); Yu-Rong Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/957,039

(22) Filed: Apr. 19, 2018

(30) Foreign Application Priority Data

Jan. 26, 2018 (TW) .............................. 107102931 A

(51) Int. Cl.
*H03K 3/00* (2006.01)
*G06F 1/08* (2006.01)
*H03K 5/24* (2006.01)
*G06F 1/12* (2006.01)
*H03K 5/00* (2006.01)

(52) U.S. Cl.
CPC ................. *G06F 1/08* (2013.01); *H03K 5/24* (2013.01); *G06F 1/12* (2013.01); *H03K 2005/00019* (2013.01); *H03K 2005/00286* (2013.01)

(58) Field of Classification Search
CPC ........ H03F 3/245; H03F 3/195; H03F 1/0227; H03F 1/0277
See application file for complete search history.

(56) References Cited

U.S. PATENT DOCUMENTS

2016/0268904 A1* 9/2016 Melendy ............. H02M 3/1584

\* cited by examiner

*Primary Examiner* — Sibin Chen
(74) *Attorney, Agent, or Firm* — Li & Cai Intellectual Property (USA) Office

(57) ABSTRACT

A phase adjusting device provided includes a main delay circuit, a first converter, a second converter, a first buck circuit, and a second buck circuit. The main delay circuit receives an input clock signal to generate a main delay signal. The first converter receives the input clock signal to generate a first conversion signal. The second converter is coupled to the main delay circuit to receive the main delay signal and generate a second conversion signal. The first buck circuit is coupled to the first converter to receive the first conversion signal and generate a first buck voltage. The second buck circuit is coupled to the second converter to receive the second conversion signal and generate a second buck voltage. A first phase difference is formed between the main delay signal and the input clock signal.

14 Claims, 6 Drawing Sheets

PHASE ADJUSTING DEVICE AND SYSTEM

CROSS-REFERENCE TO RELATED APPLICATION

This application claims priority to Taiwan Patent Application No. 107102931, filed on Jan. 26, 2018, the disclosure of which is incorporated herein in its entirety by reference.

BACKGROUND OF THE INVENTION

1. Field of the Invention

The present disclosure relates to a phase adjusting device and system, and in particular, to a phase adjusting device and system for generating multiphase delay signals through multiple delay circuits.

2. Description of Related Art

When a circuit system operates in frequency synchronization, all channels are turned on at the same time, which may result in a large drop of the input voltage and electromagnetic interferences (EMI).

Most existing circuit systems can only shift the phases of signals in different channels in a single integrated circuit, but cannot stagger the signals in different integrated circuits.

Therefore, in order to solve the problem of voltage drop and electromagnetic interferences caused by phase interference, it is necessary to propose a device and a system that can shift the phase of the signals between the integrated circuits.

SUMMARY OF THE INVENTION

In order to solve the problem of voltage drop and electromagnetic interferences caused by phase interference, an embodiment of the present application provides a phase adjusting device including a a main delay circuit, a first converter, a second converter, a first buck circuit, and a second buck circuit. The main delay circuit is configured to receive an input clock signal to generate a main delay signal, the main delay circuit includes a first comparator and a first pulse output unit. A first input terminal of the first comparator is coupled to a first voltage through a first switch circuit, a second input terminal is coupled to a second voltage through a first voltage divider circuit, and the first switch circuit receives the input clock signal. The first pulse output unit is coupled to an output terminal of the first comparator, and the first pulse output unit outputs the main delay signal. The first converter is configured to receive the input signal to generate a first conversion signal. The second converter is coupled to the main delay circuit to receive the main delay signal, and is configured to generate a second conversion signal. The first buck circuit is coupled to the first converter to receive the first conversion signal, and is configured to generate a first buck voltage. The second buck circuit is coupled to the second converter to receive the second conversion signal, and is configured to generate a second buck voltage. A first phase difference is formed between the main delay signal and the input clock signal.

According to another embodiment of the present disclosure, there is provided a phase adjusting system having a main device and a secondary device coupled to each other. The main device includes a main delay circuit, a first converter, a second converter, a first buck circuit, a second buck circuit, and a secondary delay circuit. The main delay circuit is configured to receive an input clock signal to generate a main delay signal, and the main delay circuit includes a first comparator and a first pulse output unit. A first input terminal of the first comparator is coupled to a first voltage through a first switch circuit, a second input terminal is coupled to a second voltage through a first voltage divider circuit, and the first switch circuit receives the input clock signal. The first pulse output unit coupled to an output terminal of the first comparator, and the first pulse output unit outputs the main delay signal. The first converter is configured to receive the input signal to generate a first conversion signal. The second converter is coupled to the main delay circuit to receive the main delay signal, and is configured to generate a second conversion signal. The first buck circuit coupled to the first converter to receive the first conversion signal, and configured to generate a first buck voltage. The second buck circuit is coupled to the second converter to receive the second conversion signal, and is configured to generate a second buck voltage. The secondary delay circuit coupled to the main delay circuit to receive the main delay signal, and is configured to generate a secondary delay signal. A first phase difference is formed between the main delay signal and the input clock signal, and a second phase difference is formed between the secondary delay signal and the main delay signal.

The phase adjusting device and system of the present application delays the input clock signal through the main delay circuit, and the generated main delay signal will be used as a reference for different chips or voltage output architectures in the system, and the phase can be shifted when multiple voltages are output, such that the voltage drop and electromagnetic interferences problems caused by all the channels being turned on at the same time when the circuit system operates in frequency synchronization may be avoided.

On the other hand, in addition to using the external input clock signal, the phase adjusting device may also include a clock generating circuit for adjusting the amount of phase delay according to the input voltage and the output voltage, and may be used in conditions where a multi-signal transmission channel or multiple circuits are utilized to optimize the amount of the phase delay.

To further understand the techniques, means and effects of the present disclosure applied for achieving the prescribed objectives, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

First Embodiment

Figure 1:
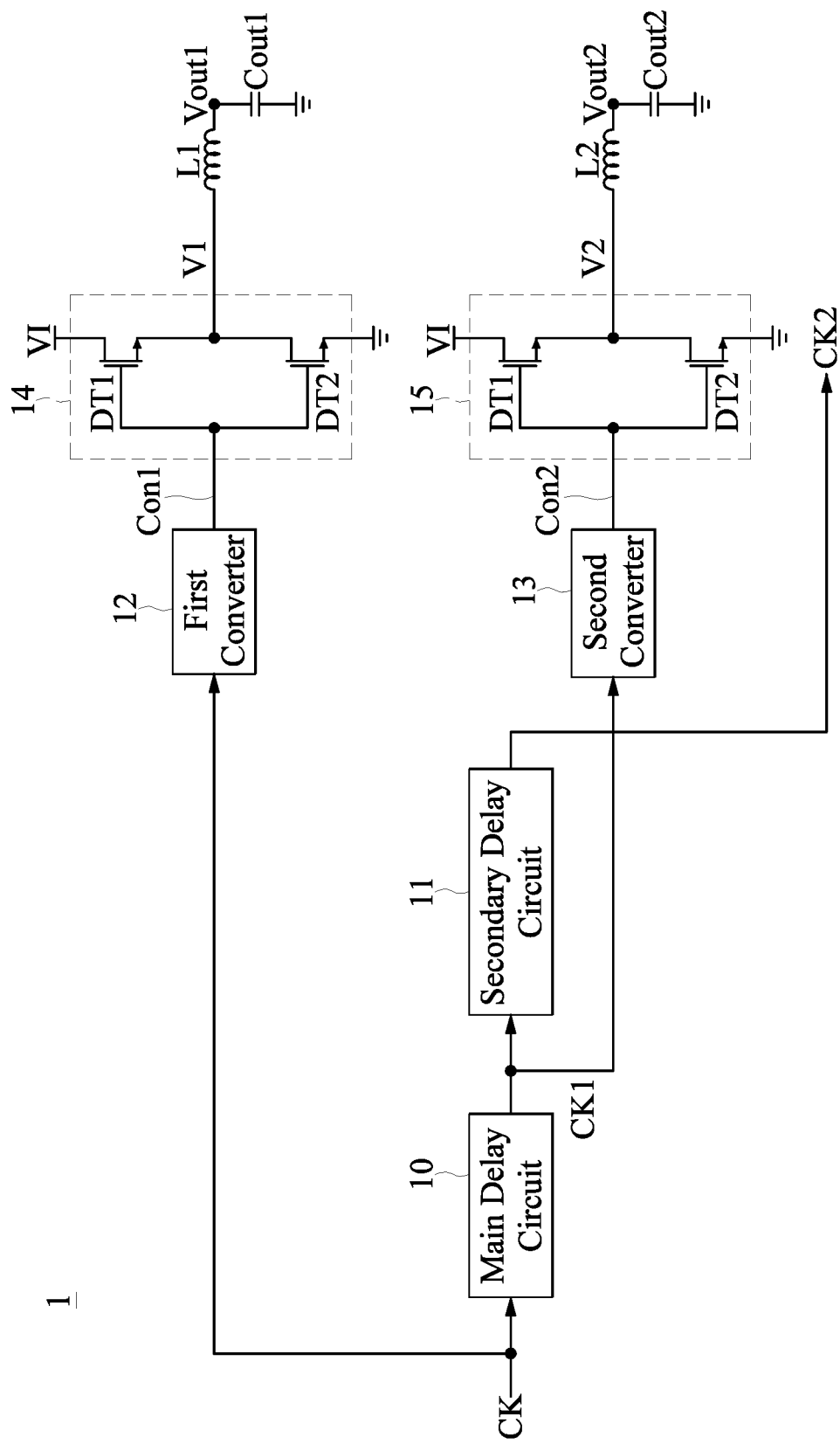
FIG. 1 is a schematic diagram of a phase adjusting device according to a first embodiment of the present disclosure.

Referring to FIG. 1, which is a schematic diagram of a phase adjusting device according to a first embodiment of the present disclosure. As shown in FIG. 1, the phase adjusting device 1 includes a main delay circuit 10, a secondary delay circuit 11, a first converter 12, a second converter 13, a first buck circuit 14, and a second buck circuit 15. The main delay circuit 10 is configured to receive an input clock signal CK to generate a main delay signal CK1, and a phase difference is formed between the main delay signal CK1 and the input clock signal CK. Specifically, in order to avoid the voltage drop and electromagnetic interference caused by the simultaneous conduction of all the channels during the frequency synchronization of the circuit system, the main delay circuit 10 delays the input clock signal CK, and the generated main delay signal CK1 would be used as a reference for different chips or voltage output architectures in the circuit system, and the phases of multiple voltages may be staggered when being output.

In this embodiment, the phase adjusting device 1 includes the first converter 12 and the second converter 13 that can be used for generating the output voltages Vout1 and Vout2. The first converter 12 first receives the input clock signal CK to generate a first conversion signal Con1. The first buck circuit 14 is coupled to the first converter 12 for receiving the first conversion signal Con1, and generating the first buck voltage V1. The first buck circuit 14 includes a first buck transistor DT1 and a second buck transistor DT2, a drain electrode of the first buck transistor DT1 is connected to a buck voltage V1, a source electrode of the first buck transistor DT1 is coupled to a drain electrode of the second buck transistor DT2, and a source electrode of the second buck transistor DT2 is connected to ground. In addition, a gate electrode of the first buck transistor DT1 is connected to a gate electrode of the second buck transistor DT2, and the first switch signal Con1 is input to the gate electrode of the first buck transistor DT1 of the first buck circuit 14. The first buck circuit 14 can generate an output voltage Vout1 related to the frequency or phase of the input clock signal CK through the configuration of a inductor L1 and a capacitor Cout1 according to the first conversion signal Con1.

On the other hand, the second converter 13 is coupled to the main delay circuit 10. The main delay circuit 10 is configured to receive the main delay signal CK1 generated by the main delay circuit 10, and to generate a second conversion signal Con2. The second buck circuit 15 is coupled to the second converter 13 for receiving the second conversion signal Con2 and generating the second buck voltage V2. The second buck circuit 15 has a circuit structure similar to that of the first buck circuit 14. The second switching signal Con2 is input to the gate electrode of the first buck transistor DT1 and the gate electrode of the second buck transistor DT2 in the second buck circuit 15. The output voltage Vout2 related to the frequency and phase of the main delay signal CK1 may then be generated through the configuration of the inductor L2 and the capacitor Cout2.

In addition to outputting the phase-staggered output voltages Vout1 and Vout2 by providing the main delay signal CK1 to different voltage output architectures, the phase adjusting device 1 may further include a secondary delay circuit 11 for outputting another delay clock signal. Specifically, the secondary delay circuit 11 receives the main delay signal CK1 and generates the secondary delay signal CK2. Another phase difference is also formed between the secondary delay signal CK2 and the main delay signal CK1, which may be the same as or different from the phase difference between the main delay signal CK1 and the input clock signal CK.

In this architecture, not only the startup time of multiple DC-DC converters of the present chip can be staggered, but also the voltage output architecture in the other chips can be controlled through the secondary delay signal CK2. Therefore, the capacitance of the input capacitor used to reduce the system voltage drop can be reduced. On the other hand, in addition to using the external input clock signal, the phase adjusting device may also include a clock generating circuit for adjusting the amount of phase delay according to the input voltage and the output voltage. The detailed architecture of the main delay circuit, the secondary delay circuit, and the clock generating circuit will be described in detail hereinafter.

Second Embodiment

Figure 2A:
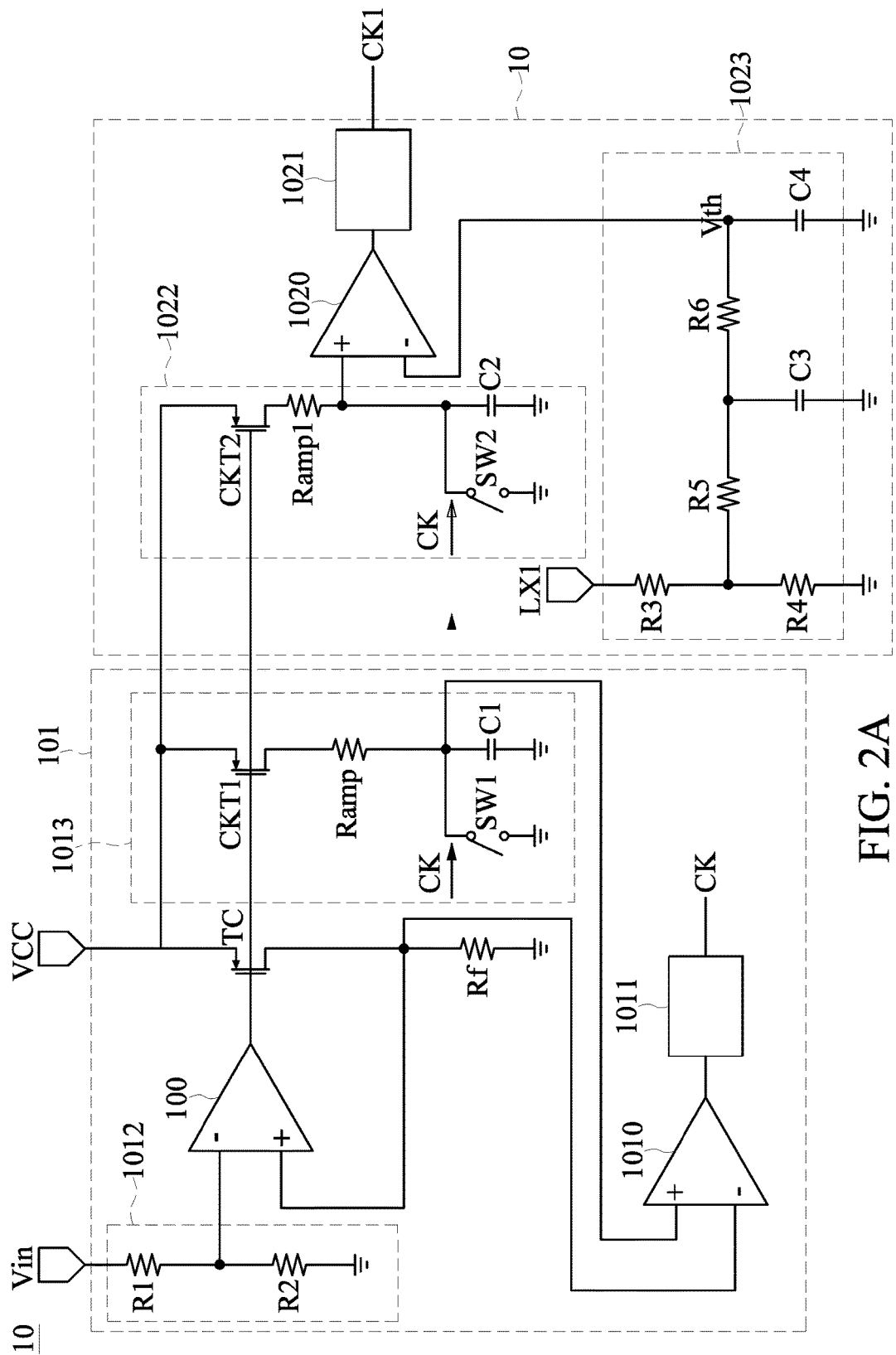
FIG. 2A is a circuit layout diagram of a clock generating circuit and a main delay circuit according to a second embodiment of the present disclosure.
Figure 2B:
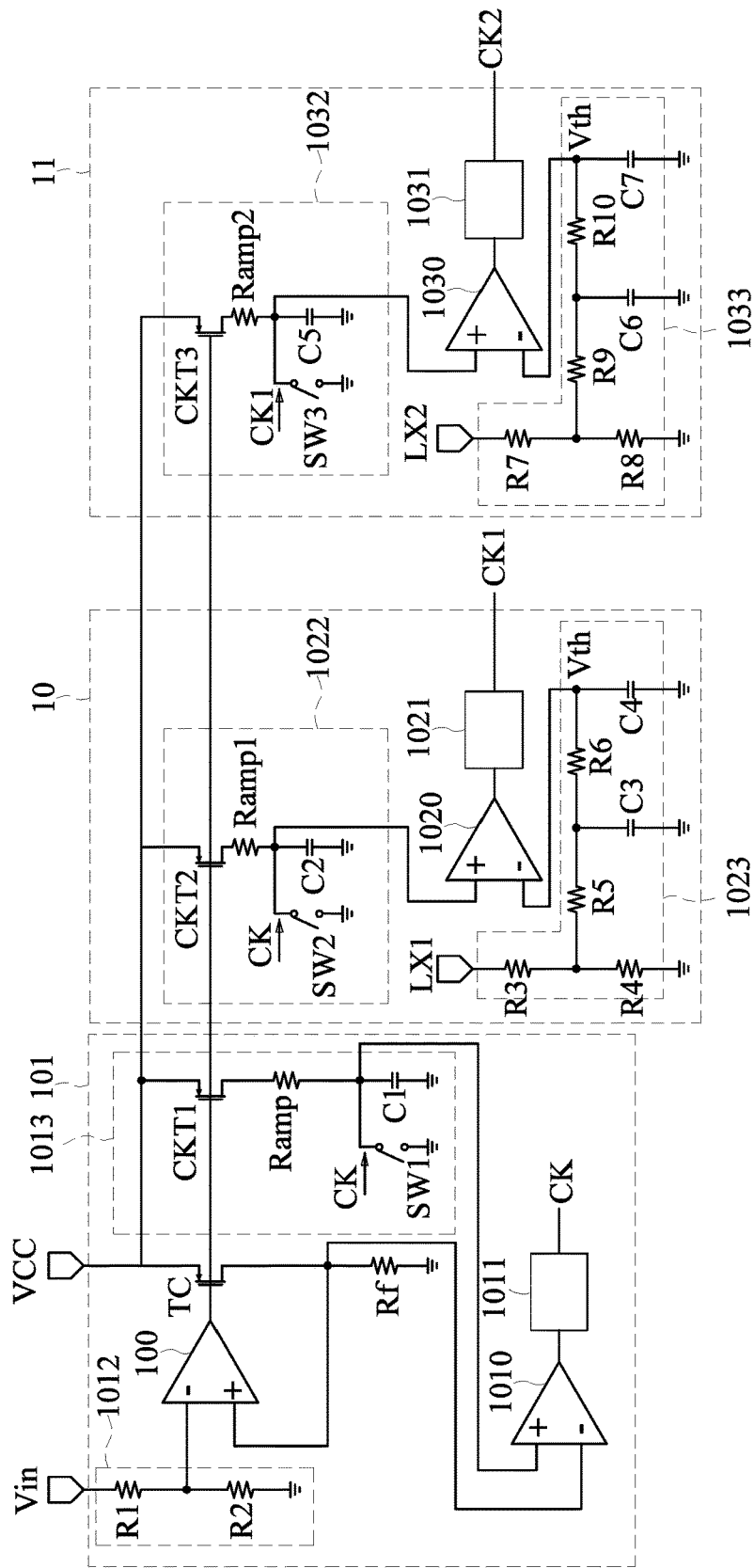
FIG. 2B is a circuit layout of a clock generating circuit, a main delay circuit and a secondary delay circuit according to the second embodiment of the present disclosure.

Reference is now made to FIGS. 2A and 2B, FIG. 2A is a circuit layout diagram of a clock generating circuit and a main delay circuit according to a second embodiment of the present disclosure, and FIG. 2B is a circuit layout of a clock generating circuit, a main delay circuit and a secondary delay circuit according to the second embodiment of the present disclosure.

As shown in FIG. 2A, the main delay circuit 10 includes a first comparator 1020, a first pulse output unit 1021, a first switch circuit 1022, and a first voltage divider circuit 1023. The first input terminal of the first comparator 1020 is coupled to the first voltage VCC via the first switch circuit 1022, the second input terminal of the first comparator 1020 is coupled to the second voltage LX1 via the first voltage divider circuit 1023, and the first switch circuit 1022 is configured to be controlled by the input clock CK. The first pulse output unit 1021 is coupled to the output terminal of the first comparator 1020 and outputs the main delay signal CK1.

In more detail, the first switch circuit 1022 includes a capacitor C2 coupled between the first input terminal of the first comparator 1020 and the ground. The switch SW2 is coupled to the first input terminal of the first comparator 1020 and the ground, and has a control terminal that receives the input clock signal CK. The first delay resistor Ramp1 is coupled between the first input terminal of the first comparator 1020 and the first voltage VCC.

On the other hand, the first voltage divider circuit 1023 includes the resistors R3, R4, R5, and R6 and the capacitors C3 and C4. By the voltage division of the first voltage divider circuit 1023, the second voltage LX1 generates a voltage Vth at the second terminal of the first comparator 1020. When the switch SW2 receives the high potential portions of the input clock signal CK, the switch SW2 is turned on so that the voltage of the capacitor C2 is reset.

When the input clock signal CK varies from the high potential portions to the low potential portions, the switch SW2 is turned off and the first voltage VCC charges the capacitor C2 until the voltage at the first input terminal of the first comparator 1020 is equal to the voltage Vth. Meanwhile, the first pulse output unit 1021 is triggered to generate the main delay signal CK1 that is delayed by performing the above operation, and a phase difference may further form between the input clock signal CK and the main delay signal CK1. The first transistor CKT2 shown in FIG. 2A is preset to be turned ON when only the external input clock signal CK is provided and may be utilized in different ways when the built-in clock generating circuit is provided.

The architecture of the main delay circuit 10 has been described above. According to the embodiment of the present disclosure, the phase adjusting device 1 may further include a clock generating circuit 101 for outputting the input clock signal CK, and a delay amount related to the input voltage and the output voltage may be generated based on this architecture. Specifically, the clock generating circuit 101 of the present disclosure includes a third comparator 100, a third voltage divider circuit 1012, a fourth comparator 1010, a third switch circuit 1013, a third pulse output unit 1011, and a first clock transistor TC. The first input terminal of the third comparator 100 is connected to the input voltage Vin via a third voltage divider circuit 1012. The third voltage divider circuit 1012 includes resistors R1 and R2 to generate a divided voltage input to a first terminal of the third comparator 100. The output terminal of the third comparator 100 is connected to a control terminal of the first clock transistor TC. The first clock transistor TC is coupled between a first clock resistor Rf and a first voltage VCC.

A first input terminal of the fourth comparator 1010 is connected to the first voltage VCC via the third switch circuit 1013, and a second input terminal of the fourth comparator 1010 is connected to the second input terminal of the third comparator 100, connected to the ground via the clock resistor Rf, and connected to the first voltage VCC through the first clock transistor TC.

The third pulse output unit 1011 is connected to an output terminal of the fourth comparator 1010 and outputs the input clock signal CK. The output terminal of the third comparator 100 is further connected to a first control terminal of the third switch circuit 1013, and a second control terminal of the third switch circuit 1013 receives the input clock signal CK.

In more detail, the third switch circuit 1013 includes a capacitor C1, a switch SW1, a resistor Ramp, and a second clock transistor CKT1. The capacitor C1 is coupled between the first input terminal of the fourth comparator 1010 and the ground. The switch SW1 is coupled between the first input terminal of the fourth comparator 1010 and the ground, and has a control terminal for receiving the input clock signal CK as the second control terminal of the third switch circuit 1013 mentioned above. The resistor Ramp is coupled to the first input terminal of the fourth comparator 1010 and is coupled to the first voltage VCC through the second clock transistor CKT2. A control terminal of the second clock transistor CKT1 is coupled to the output terminal of the third comparator 100 and serves as the first control terminal of the third switch circuit 1013 mentioned above.

In this architecture, the third comparator 100 initially outputs a voltage with low potential, and the first clock transistor TC, the second clock transistor CKT1, and the first transistor CKT2 may be P-type metal-oxide-semiconductors (PMOS) that are turned ON while receiving the voltage with low potential output from the third comparator 100. At this time, the first voltage VCC charges the capacitors C1 and C2 until the voltage at the second input of the third comparator 100 becomes equal to the divided voltage of the input voltage Vin. The third comparator 100 outputs a voltage with high potential to force the first clock transistor TC, the second clock transistor CKT1 and the first transistor CKT2 to be turned OFF. On the other hand, the first input voltage of the fourth comparator 1010 is the first voltage VCC, and when the voltage at the second input terminal is pulled by the drain electrode of the first clock transistor TC to the first voltage VCC, the output terminal of the fourth comparator 1010 outputs a voltage with high potential to trigger the third pulse output unit 1011 to generate the input clock signal CLK.

When the input clock signal CLK is input to the switch SW1, the switch SW1 is turned on to reset the voltage of the capacitor C1, and the fourth comparator 1010 outputs a voltage with low potential due to a voltage variation. The third pulse output unit 1011 is turned off, and is configured to be triggered the next time that the voltages of the first and second input terminals of the fourth comparator 1010 vary to be equal to each other, to generate the input clock signal CLK with a specific period.

Accordingly, the related values in the above embodiments can be obtained by the following formulas:

$$T_{CLK} = \frac{C_{C1} \times \frac{R2}{R1+R2} \times Vin}{\frac{R2}{R1+R2} \times \frac{Vin}{Rf}} = C_{C1} \times Rf \quad \text{(Fomula 1)}$$

$$D = \frac{C_{C2} \times \frac{R4}{R3+R4} \times Vout}{\frac{R2}{R1+R2} \times \frac{Vin}{Rf}} = \quad \text{(Fomula 2)}$$

$$\frac{R4}{R3+R4} \times \frac{R1+R2}{R2} \times C_{C2} \times Rf \times \text{Duty} =$$

$$C_{C1} \times Rf \times \text{Duty} = T_{CLK} \times \text{Duty}$$

Where $T_{CLK}$ is the input clock value, D is amount of the phase delay, Duty is the voltage conversion ratio (Vout/Vin), the resistance of the resistor R1 is R1, the resistance of the resistor R2 is R2, the resistance of the resistor R3 is R3, the resistance of the second delay resistor R4 is R4, the capacitance of the capacitor C1 is $C_{C1}$, the capacitance of the capacitor C2 is $C_{C2}$, the resistance of the first clock resistor Rf is Rf, the voltage of the input voltage Vin is Vin, the voltage of the pulse is Vout. It can be seen from the formula 2 that the amount of phase delay D may be adjusted by the different voltage conversion ratios Duty.

Referring to FIG. 2B, the secondary delay circuit 11 includes a second comparator 1030, a second pulse output unit 1031, a second switch circuit 1032, and a second voltage divider circuit 1033. A first input terminal of the second comparator 1030 is coupled to the first voltage VCC via the second switch circuit 1032, a second input terminal of the second comparator 1030 is coupled to the third voltage LX2 via the second voltage divider circuit 1033, and the second switch circuit 1032 is controlled by the main delay signal CK1. The second pulse output unit 1031 is coupled to an output terminal of the second comparator 1030 and outputs the secondary delay signal CK2.

In more detail, the second switch circuit 1032 includes a capacitor C5 coupled between the first input terminal of the second comparator 1030 and the ground, a switch SW2 coupled between the first input terminal of the second comparator 1030 and the ground, and has a control terminal that receives the main delay signal CK1. The second delay resistor Ramp2 is coupled between the first input terminal of the second comparator 1030 and the first voltage VCC.

On the other hand, the second voltage divider circuit 1033 includes resistors R7, R8, R9 and R10 and capacitors C6 and C7. By the voltage division of the second voltage divider circuit 1033, the third voltage LX2 generates a voltage Vth at the second terminal of the second comparator 1030. When the switch SW3 receives the high potential portions of the main delay signal CK1, the switch SW3 is turned on so that the voltage of the capacitor C5 is reset. When the main delay signal CK1 varies from the high potential portions to the low potential portions, the switch SW3 is turned off and the first voltage VCC charges the capacitor C5 until the voltage at the first input terminal of the second comparator 1030 is equal to the voltage Vth. Meanwhile, the second pulse output unit 1031 is triggered to generate the secondary delay signal CK2 that is delayed by performing the above operation, and a phase difference may further form between the main delay signal CK1 and the secondary delay signal CK2. The second transistor CKT3 shown in the figure is preset to be turned ON when only the external input clock CK is provided and may be utilized in different ways when the built-in clock generating circuit is provided.

In the above embodiments, not only the startup time of multiple DC-DC converters of the present chip can be staggered, but also the voltage output architecture in the other chips can be controlled through the secondary delay signal CK2. Therefore, the capacitance of the input capacitor used to reduce the system voltage drop can be reduced. On the other hand, in addition to using the external input clock signal, the phase adjusting device may also include a clock generating circuit for adjusting the amount of phase delay according to the input voltage and the output voltage.

Third Embodiment

Figure 3:
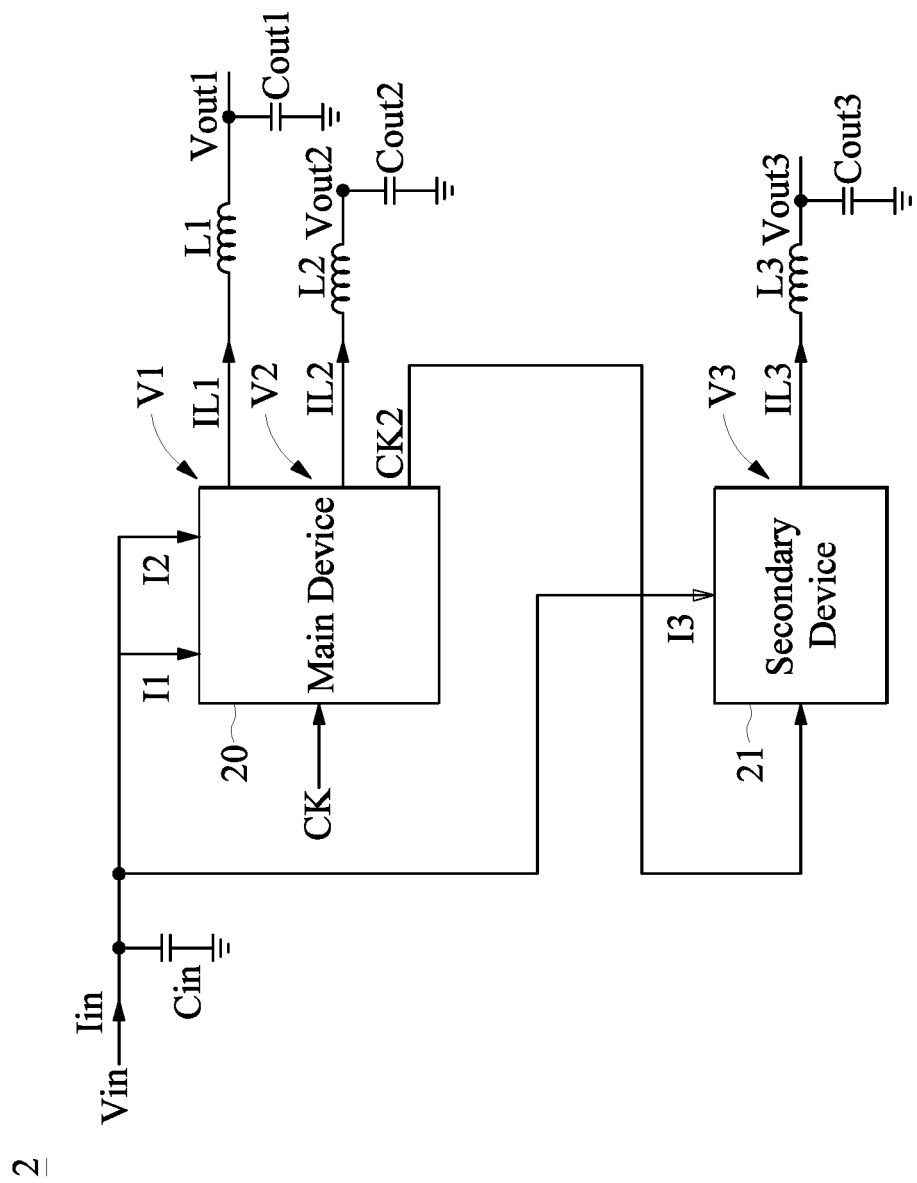
FIG. 3 is a schematic diagram of a phase adjusting system according to an embodiment of the present disclosure.
Figure 4:
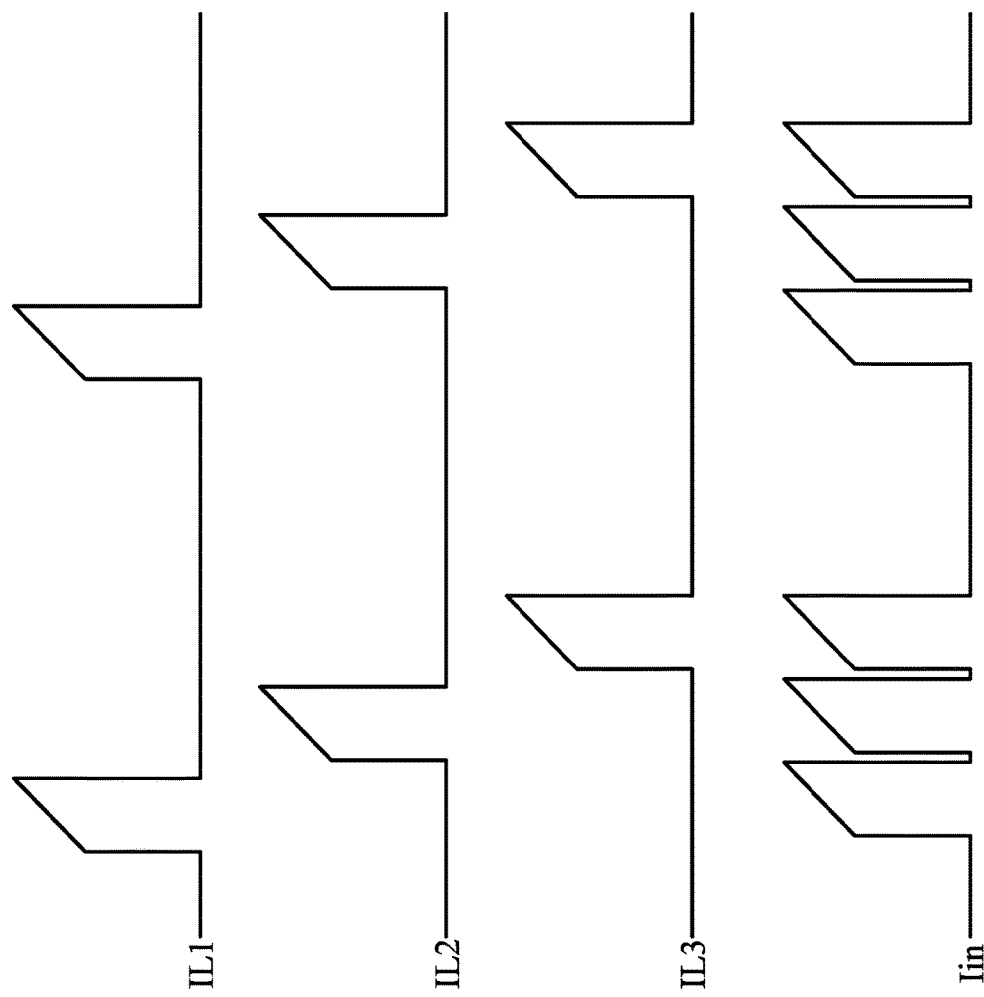
FIG. 4 is a schematic diagram of a current waveform of the phase adjusting system in FIG. 3.

Reference is now made to FIGS. 3 and 4 together. FIG. 3 is a schematic diagram of a phase adjusting system 2 according to an embodiment of the present disclosure, FIG. 4 is a schematic diagram of a current waveform of the phase adjusting system in FIG. 3. As shown in FIG. 3, the phase adjusting system 2 has a main device 20 and a secondary device 21 that are coupled to each other. The main device 20, similar with the phase adjusting device 1, includes the main delay circuit 10, the secondary delay circuit 11, the first converter 12, the second converter 13, the first step-down circuit 14, and the second step-down circuit 15. The related descriptions are the same as that of the embodiments of FIGS. 1, 2A and 2B, and the description thereof will not be reiterated herein. In the following description, the related elements follow the reference numerals provided in FIGS. 1 and 2.

As shown in FIG. 3, an input current Iin is divided into a first current, a second current I2 and a third current I3 provided with the same clock. The first current I1 and the second current I2 flow into the main device 20, and the third current flows into the secondary device 21. The second current I2 passes through the main delay circuit 10 and the secondary delay circuit 11, and the clock of the second current I2 is exactly as the same as that of the input clock signal CK of the main delay circuit 10. The main delay signal CK1 outputted by the main delay circuit 10 is the clock of the current IL2 (i.e., the voltage V2, and which generates the output voltage Vout2 through the inductor L2 and the capacitor Cout2) outputted by the main device 20, and the first current I1 does not flow through the main delay circuit 10. The current IL1 outputted by the main device 20 (i.e., the voltage V1, and which generates the output voltage Vout1 through the inductor L1 and the capacitor Cout1) has the same clock as the first current I1, that is, the input clock signal CK. The secondary delay signal CK2 outputted by the secondary delay circuit 11 is the clock outputted by the main device 20, which is also input to the secondary device 21, and the current IL3 outputted by the secondary device 21 (i.e., the voltage V3, and which generates the output voltage Vout3 through the inductor L3 and the capacitor Cout3) generated by is also a clock signal, that is, the secondary delay signal CK2.

That is, in the main device 20, the input clock CK is processed by the main delay circuit 10 and the secondary delay circuit 11 to output the secondary delay signal CK2 serving as the clock synchronization signal of the secondary device 21. In addition, in other embodiments, if different signal transmission channels are activated in the main device 20, a phase delay may be generated correspondingly.

For example, when a signal is input to the main device 20, the signal will pass through the main delay circuit 10 and the secondary delay circuit 11 while being processed by the first delay process and the second delay process, respectively. A first phase difference may form between the main delay signal and the signal, and a second phase difference may form between the secondary delay signal and the signal, respectively, the first phase difference being different from the second phase difference. In other words, when the signal is input to the main device, the main device outputs the original signal and the main delay signal generated after the signal is processed by the main delay circuit, and the secondary delay circuit outputs the secondary delay signal after the main delayed signal is further processed by the secondary delay circuit, in which the main and secondary delay signals have different phase differences compared with the original signal. Therefore, the voltage drop and electromagnetic interferences of the circuit system may be reduced by the phase difference when the secondary delay signal is input to the secondary device.

In other embodiments, the control of the amount D of phase delay may be classified into a fixed type and a dynamic adjustment type. The fixed type can adjust the amount D of phase delay via an external pin of the circuit system. The dynamic adjustment type can determine the amount D of phase delay according to the current input/output voltages, and the amount D of phase delay may be optimized under the condition that multiple signal transmission channels or multiple circuits (such as the main device 20 and the secondary device 21 described above) are utilized.

Fourth Embodiment

Figure 5:
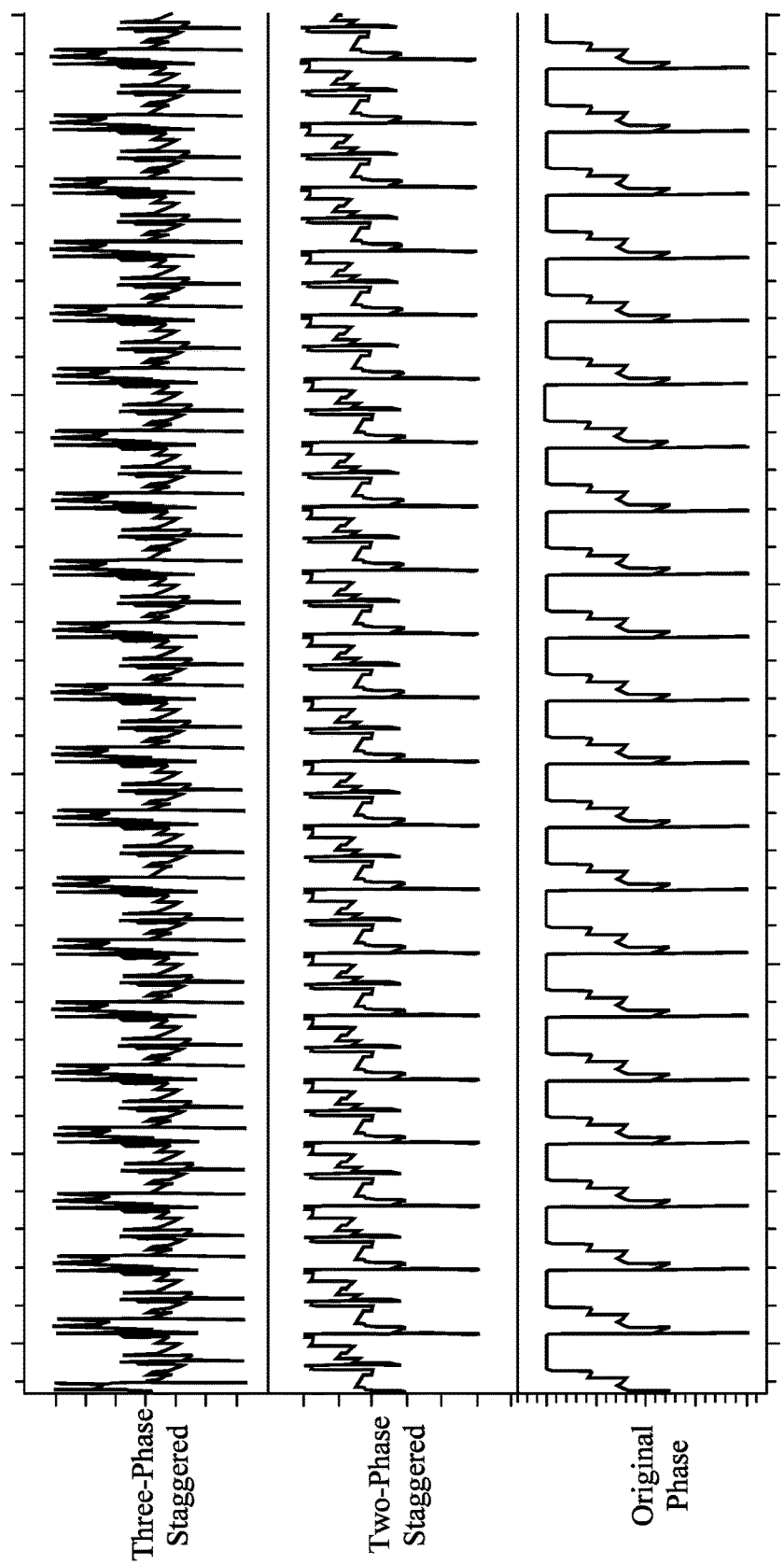
FIG. 5 is a schematic diagram of the current waveform after being adjusted by the phase adjusting device and system of the present disclosure.

Reference is now made to FIG. 5. FIG. 5 is a schematic diagram of the current waveform after being adjusted by the phase adjusting device and the system of the present disclosure. As shown in FIG. 5, the original phase waveform has a larger voltage drop than those of the two-phase staggered waveform and the three-phase staggered waveform, and the two-phase staggered waveform has a larger voltage drop than that of the three-phase staggered waveform. That is, the voltage drop may be reduced by staggering the phases of different signals, and the required input capacitance can become smaller. That is, after the phases are staggered, the voltage drop becomes smaller for the same capacitance of the capcitor Cin as depicted in FIG. 3, and the larger the phase difference of the phase is, the smaller the voltage drop obtained for the same capacitance value will be, as in the case of FIG. 5 where the voltage drop of the three-phase staggered waveform is smaller than that of the two-phase staggered waveform.

Compared with the prior art, the phase adjusting device and system of the present disclosure may not only stagger the turn-on time of multiple sets of DC-DC converters in the present circuit and activate other circuits, but also stagger the phases of the signals of different integrate circuits to reduce the maximum system current and input capacitance, such that the pressure drop and electromagnetic interference caused by the phase interferences may be eliminated.

The description of the different exemplary embodiments has been presented for purposes of illustration and description, and is not intended to be exhaustive or limited to the disclosure in the form disclosed. Many modifications and variations will be apparent to those of ordinary skill in the art. Further, different exemplary embodiments may provide different advantages as compared to other exemplary embodiments. The embodiment or embodiments selected are chosen and described in order to best explain the principles of the disclosure, the practical application, and to enable others of ordinary skill in the art to understand the disclosure for various embodiments with various modifications as are suited to the particular use contemplated.

What is claimed is:

1. A phase adjusting device, comprising:
   a main delay circuit configured to receive an input clock signal to generate a main delay signal, wherein the main delay circuit includes:
      a first comparator, wherein a first input terminal of the first comparator is coupled to a first voltage through a first switch circuit, a second input terminal is coupled to a second voltage through a first voltage divider circuit, and the first switch circuit receives the input clock signal; and
      a first pulse output unit coupled to an output terminal of the first comparator, and the first pulse output unit outputs the main delay signal;
   a first converter configured to receive the input clock signal to generate a first conversion signal;
   a second converter coupled to the main delay circuit to receive the main delay signal, and configured to generate a second conversion signal;
   a first buck circuit coupled to the first converter to receive the first conversion signal, and configured to generate a first buck voltage; and
   a second buck circuit coupled to the second converter to receive the second conversion signal, and configured to generate a second buck voltage;
   wherein a first phase difference is formed between the main delay signal and the input clock signal.

2. The phase adjusting device according to claim 1, wherein the first switch circuit comprises:
   a first capacitor coupled between the first input terminal of the first comparator and a ground;
   a first switch coupled between the first input terminal of the first comparator and the ground, and the first switch has a control terminal for receiving the input clock signal; and
   a first delay resistor coupled to the first input terminal of the first comparator, and coupled to the first voltage through a first transistor.

3. The phase adjusting device according to claim 2, further comprising:
   a secondary delay circuit coupled to the main delay circuit to receive the main delay signal, wherein the secondary delay circuit includes:
      a second comparator, wherein a first input terminal of the second comparator is coupled to the first voltage through a second switch, a second input terminal of the second comparator is coupled to a third voltage through a second voltage divider circuit, and the second switch circuit receives the input clock signal; and
      a second pulse output unit coupled to an output terminal of the second comparator, and configured to output a secondary delay signal,
   wherein a second phase difference is formed between the secondary delay signal and the input clock signal.

4. The phase adjusting device according to claim 3, wherein the second switch includes:
   a second capacitor coupled between the first input terminal of the second comparator and a ground;
   a second switch coupled between the first input terminal of the second comparator and the ground, and the second switch has a control terminal for receiving the input clock signal; and
   a second delay resistor coupled to the first input terminal of the second comparator, and coupled to the first voltage through a second transistor.

5. The phase adjusting device according to claim 1, wherein the first buck circuit and the second buck circuit each includes a first buck transistor and a second buck transistor, and a source electrode of the first buck transistor is coupled to a drain electrode of the second buck transistor.

6. The phase adjusting device according to claim 2, further comprising a clock generating circuit for outputting the input clock signal, wherein the clock generating circuit includes:
   a third comparator, wherein a first input terminal is coupled to an input voltage through a third voltage divider circuit, an output terminal of the third comparator is coupled to a control terminal of a first clock transistor, and the first clock transistor is coupled between a first clock resistor and the first voltage;
   a fourth comparator, wherein a first input terminal is coupled to the first voltage through a third switch, a second input terminal of the fourth comparator is coupled to the second input terminal of the third comparator and is coupled to the first voltage through the first clock transistor; and
   a third pulse output unit coupled to a output terminal of the fourth comparator, and configured to output the input clock signal,
   wherein the output terminal of the third comparator is further coupled to a control terminal of the third switch circuit and a control terminal of the first transistor, and a second control terminal receives the input clock signal.

7. The phase adjusting device according to claim 6, wherein the third switch circuit includes:
   a third capacitor coupled between the first input terminal of the fourth comparator and a ground;
   a third switch coupled between the first input terminal of the fourth comparator and the ground, and the third switch has a control terminal for receiving the input clock signal; and a second clock resistor coupled to the first input terminal of the fourth comparator, and coupled to the first voltage through a second clock transistor, wherein a control terminal of the second clock transistor is coupled to the output terminal of the third comparator.

8. A phase adjusting system, having a main device and a secondary device coupled to each other, wherein the main device includes:

a main delay circuit configured to receive an input clock signal to generate a main delay signal, wherein the main delay circuit includes:

a first comparator, wherein a first input terminal of the first comparator is coupled to a first voltage through a first switch circuit, a second input terminal is coupled to a second voltage through a first voltage divider circuit, and the first switch circuit receives the input clock signal; and a first pulse output unit coupled to an output terminal of the first comparator, and the first pulse output unit outputs the main delay signal;

a first converter configured to receive the input clock signal to generate a first conversion signal;

a second converter coupled to the main delay circuit to receive the main delay signal, and configured to generate a second conversion signal;

a first buck circuit coupled to the first converter to receive the first conversion signal, and configured to generate a first buck voltage;

a second buck circuit coupled to the second converter to receive the second conversion signal, and configured to generate a second buck voltage; and a secondary delay circuit coupled to the main delay circuit to receive the main delay signal, and configured to generate a secondary delay signal;

wherein a first phase difference is formed between the main delay signal and the input clock signal, and a second phase difference is formed between the secondary delay signal and the main delay signal.

9. The phase adjusting system according to claim 8, wherein the first switch circuit includes:

a first capacitor coupled between the first input terminal of the first comparator and a ground;

a first switch coupled between the first input terminal of the first comparator and the ground, and the first switch has a control terminal for receiving the input clock signal; and a first delay resistor coupled to the first input terminal of the first comparator, and coupled to the first voltage through a first transistor.

10. The phase adjusting system according to claim 8, wherein the secondary delay circuit includes:

a second comparator, wherein a first input terminal of the second comparator is coupled to the first voltage through a second switch, a second input terminal of the second comparator is coupled to a third voltage through a second voltage divider circuit, and the second switch circuit receives the input clock signal; and a second pulse output unit coupled to an output terminal of the second comparator, and configured to output a secondary delay signal.

11. The phase adjusting system according to claim 10, wherein the second switch includes:

a second capacitor coupled between the first input terminal of the second comparator and a ground;

a second switch coupled between the first input terminal of the second comparator and the ground, and the second switch has a control terminal for receiving the input clock signal; and a second delay resistor coupled to the first input terminal of the second comparator, and coupled to the first voltage through a second transistor.

12. The phase adjusting system according to claim 8, wherein the first buck circuit and the second buck circuit each includes a first buck transistor and a second buck transistor, and a source electrode of the first buck transistor is coupled to a drain electrode of the second buck transistor.

13. The phase adjusting system according to claim 9, further comprising a clock generating circuit for outputting the input clock signal, wherein the clock generating circuit includes:

a third comparator, wherein a first input terminal is coupled to an input voltage through a third voltage divider circuit, an output terminal of the third comparator is coupled to a control terminal of a first clock transistor, and the first clock transistor is coupled between a first clock resistor and the first voltage;

a fourth comparator, wherein a first input terminal is coupled to the first voltage through a third switch, a second input terminal of the fourth comparator is coupled to the second input terminal of the third comparator and is coupled to the first voltage through the first clock transistor; and a third pulse output unit coupled to a output terminal of the fourth comparator, and configured to output the input clock signal, wherein the output terminal of the third comparator is further coupled to a control terminal of the third switch circuit and a control terminal of the first transistor, and a second control terminal receives the input clock signal.

14. The phase adjusting system according to claim 13, wherein the third switch circuit includes:

a third capacitor coupled between the first input terminal of the fourth comparator and a ground;

a third switch coupled between the first input terminal of the fourth comparator and the ground, and the third switch has a control terminal for receiving the input clock signal; and a second clock resistor coupled to the first input terminal of the fourth comparator, and coupled to the first voltage through a second clock transistor, wherein a control terminal of the second clock transistor is coupled to the output terminal of the third comparator.

* * * * *